United States Patent [19]

Van Leeuwen

[11] Patent Number: 4,926,009

[45] Date of Patent: May 15, 1990

[54] APPARATUS FOR ORGANIZING EQUIPMENT CABLES

[75] Inventor: Robert J. Van Leeuwen, Stittsville, Canada

[73] Assignee: Northern Telecom Limited, Montreal, Canada

[21] Appl. No.: 357,243

[22] Filed: May 26, 1989

[51] Int. Cl.⁵ .............................................. H05K 7/14
[52] U.S. Cl. ..................................... 174/135; 361/428
[58] Field of Search ............. 174/72 A, 135; 361/415, 361/428; 379/326, 327, 429

[56] References Cited

U.S. PATENT DOCUMENTS 2,082,099  6/1937  Cruser ........................... 174/72 A X

OTHER PUBLICATIONS

Dombroski, "Wire Holder with Quarter-Turn Mounting", *IBM Technical Disclosure Bulletin*, vol. 22, No. 8A, Jan. 1980, pp. 3310 and 3311.

Primary Examiner—Laramie E. Askin
Attorney, Agent, or Firm—Dallas F. Smith

[57] ABSTRACT

An apparatus, for attachment to an equipment frame, organizes the cables associated with each interface circuit card of the equipment. The apparatus includes a sheet metal panel having an upper slotted flange and a lower cable channel each extending along its length, giving the panel a J-shaped cross-section, and a plurality of resilient wire cable retaining members. For each group of cables, a resilient wire member is provided having a U-shaped base, substantially parallel arms and an openable gap formed by fingers projecting from the arms. The U-shaped base of the wire member is inserted into the slot corresponding to the circuit card for which the cables are to be grouped. The wire member is retained in the slot by a plurality of resilient tabs fromed on the panel. The form of the fingers is selected to facilitate insertion and extraction of the cables between cable retaining arms and to ensure retention of the cables once inserted.

10 Claims, 2 Drawing Sheets

APPARATUS FOR ORGANIZING EQUIPMENT CABLES

This invention relates to apparatus for organizing equipment cables, and is particularly concerned with such apparatus for grouping cables associated with individual circuit cards.

In telecommunications equipment and the like, interface circuits are provided on printed circuit cards for connecting cabling to the equipment. As the density of such circuits increases, through component integration and miniaturization, a greater number of interface circuits can be provided on each card. The number of cables that can be connected to an individual card is thereby increased, and becomes limited only by the relative physical sizes of connectors and the card. This may result in cable routing and organization problems. Typically, cables are grouped and secured using tie straps, a satisfactory solution for static systems. However, with software configurable systems, individual cables or whole sets of cables may need to be relocated.

An object of the present invention is to provide an improved apparatus for organizing equipment cables.

In accordance with the present invention there is provided apparatus for organizing equipment cables, comprising: an elongate panel having a substantially flat face and a flange projecting substantially perpendicularly from an edge of the panel and extending along its length, the flange having therein a plurality of elongate slots spaced apart from and aligned with each other along the length of the flange; and a plurality of resilient wire members, each having a substantially U-shaped base receivable in a respective slot of the flange, two substantially parallel arms projecting from the ends of the base, and two fingers projecting from the ends of the arms, said fingers having portions substantially adjacent one another to form a resiliently openable gap for receiving a cable therebetween; said elongate panel including means for engaging the base of each wire member to retain said member within the respective slot.

The present invention will be further understood from the following description with reference to the accompanying drawings, in which.

Figure 1:
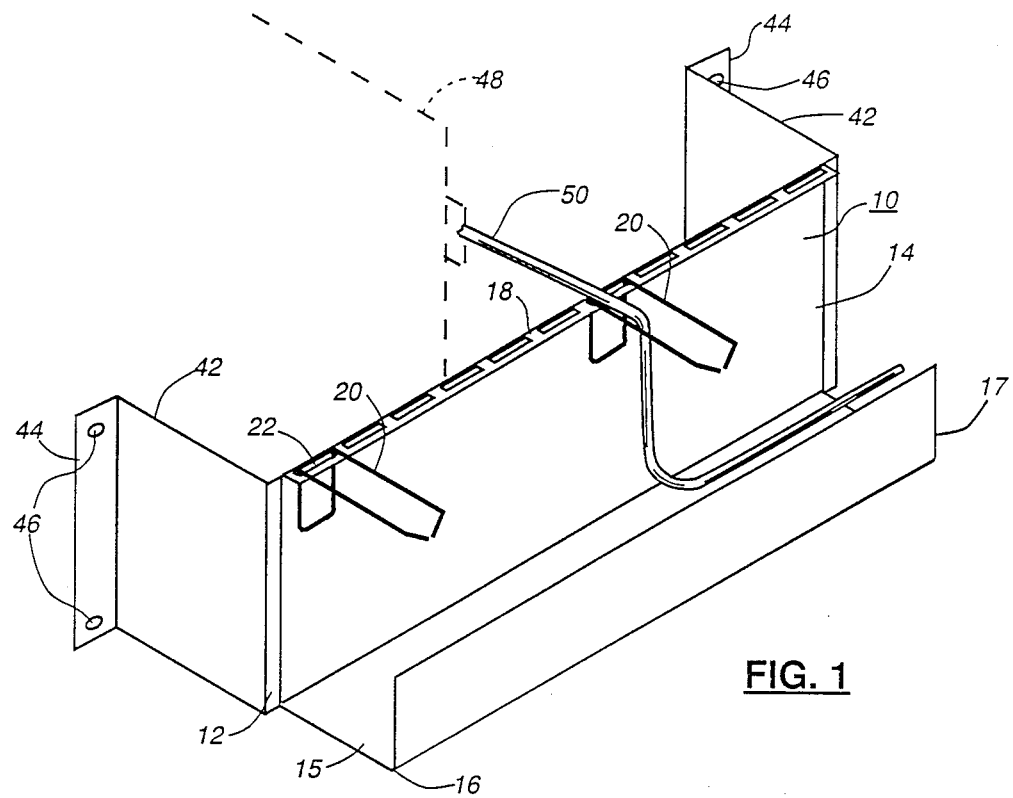
FIG. 1 is an isometric view of parts of apparatus in accordance with an embodiment of the present invention.
Figure 3:
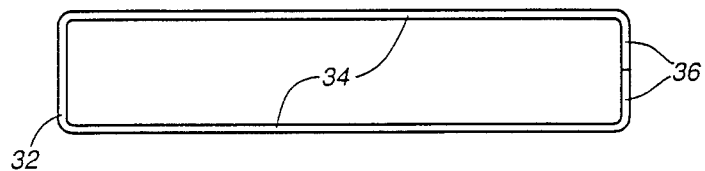
Figure 4:
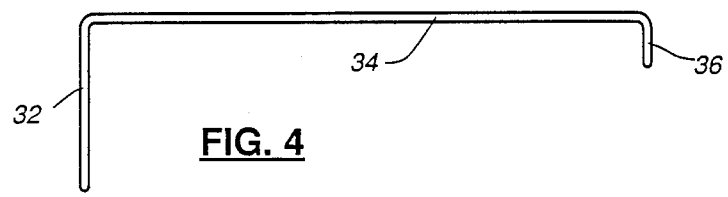
Figure 5:
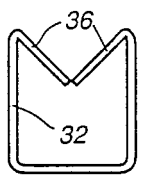
Figure 6:
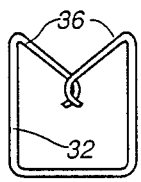

FIGS. 3, 4, and 5 are respectively plan, elevation, and end views of a resilient wire member of the apparatus of FIG. 1; and FIG. 6 is an end view of an alternative form of resilient wire member.

Figure 2:
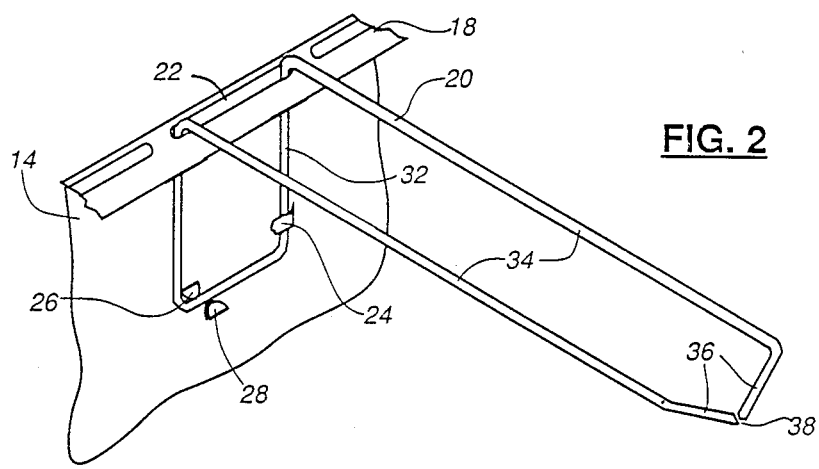
FIG. 2 is an isometric view of details of the apparatus of FIG. 1.

Referring to FIG. 1, there is illustrated parts of apparatus in accordance with an embodiment of the present invention. The apparatus for organizing equipment cables comprises an elongate panel of sheet metal, formed to J-shaped cross-section, a mounting bracket 12 for attaching the panel to the equipment frame and a plurality of resilient wire members 20, retained by the panel 10. The panel 10 includes a substantially flat upright 14, a flange 18 projecting substantially perpendicularly from the upper edge of the upright 14 and a transverse cable channel 16. The transverse cable channel 16 has a substantially horizontal portion 15 projecting substantially perpendicularly from the lower edge of the upright 14 and an up-turned portion 17 projecting substantially perpendicularly from the horizontal portion 15. The flange 18 extends along the length of the panel 10 providing therein a plurality of elongate slots 22, spaced apart from and aligned with each other along the length of the flange 18. Slots 22 are arranged so that one edge of each slot is approximately flush with the surface of the upright 14. Slots 22 are sized each to receive a wire member 20. Each wire member 20 is retained in a slot by raised tabs 24, 26, and 28 as shown in FIG. 2. Tabs 26 and 28 define a final position of the resilient wire member 20 by being raised sufficiently above the surface of the upright 14 to prevent the wire member 20 from slipping over their ends during use of the wire member 20 to group cables. The tab 24 extends over a portion of the wire member 20 thereby holding it against the upright 14.

Each resilient wire member 20, as shown in FIGS. 2-5, includes a U-shaped base 32, two substantially parallel arms 34 and two fingers 36. Fingers 36 form a V-shape with a gap 38 at the bottom. Preferably, the length of members 34 is approximately equal to the width of the cable channel 16.

The size of the tabs 24, 26 and 28 is dependent upon the thickness of the sheet steel used for the upright 14, the thickness of the wire of the resilient wire member 20 and the limitations imposed by the die used to form the tabs. For an embodiment wherein the upright 14 consists of 1.22 mm (0.048 inch) thick sheet steel and the wire member 20 consists of 2.44 mm (0.096 inch) diameter type 304 stainless steel wire, the tab 24 has approximate dimensions of 6.4 mm (0.25 inch) at its base, 5.1 mm (0.20 inch) for its extension and 5.0 mm (0.196 inch) for the height of its raised portion. Tabs 26 and 28 have a base and an extension of approximately 50 percent and 70 percent, respectively, those of the tab 24.

The mounting bracket 12, formed of sheet steel, comprises an elongate substantially flat surface for attaching and reinforcing the upright portion of panel 10 and substantially perpendicular legs 42 having out-turned mounting flanges 44 provided with mounting holes 46.

In operation, the apparatus is fastened to an equipment frame (not shown in FIG. 1) using mounting holes 46 in the mounting bracket 12. Each resilient wire member 20 is inserted into a slot 22 corresponding to an installed interface card position 48 in the associated equipment frame as shown in broken lines in FIG. 1. The lower edge of the wire member 20 is resiliently deflected by and resiliently deflects the tab 26 as it is inserted, snapping into position between tabs 26 and 28. The tab 24 is resiliently deflected by the side of the resilient wire member 20 thereby providing a retaining force substantially perpendicular to the surface of the upright 14. Cables 50 are then routed along the cable channel 16 to the desired position, an example of which is shown in FIG. 1. The cables to be grouped are pushed inwards and downwards between fingers 36 until positioned between arms 34. The resiliency of arms 34 both closes the gap 38 after the cables have passed through and retains the cables in the desired grouping.

Alternative arrangements of the fingers 36 are possible; for example, fingers 36 are shown as overlapping J-shaped fingers in FIG. 6. Further, the fingers 36 could be abutting instead of overlapping and of a number of varied shapes, such as C-shaped and V-shaped, without detracting from the operation of the apparatus.

Numerous modifications, variations and adaptations may be made to the particular embodiments of the invention described above without departing from the scope of the invention, which is defined in the claims.

What is claimed is:

1. Apparatus for organizing equipment cables, comprising:

an elongate panel having a substantially flat face and a flange projecting substantially perpendicularly from an edge of the panel and extending along its length, the flange having therein a plurality of elongate slots spaced apart from and aligned with each other along the length of the flange; and a plurality of resilient wire members, each having a substantially U-shaped base receivable in a respective slot of the flange, two substantially parallel arms projecting from the ends of the base, and two fingers projecting from the ends of the arms, said fingers having portions substantially adjacent one another to form a resiliently openable gap for receiving a cable therebetween;

said elongate panel including means for engaging the base of each wire member to retain said member within the respective slot.

2. Apparatus as claimed in claim 1 further comprising an integrally formed channel, including a substantially flat horizontal member extending along the length of the panel at the edge opposite the flange and a substantially flat vertical member projecting from the outer edge of the horizontal member only a portion of the height of the panel and extending along the outer edge of the horizontal member.

3. Apparatus as claimed in claim 2 wherein the means for engaging the base comprise resilient means for pressing the base against the flat face, and for positioning the base.

4. Apparatus as claimed in claim 3 wherein said resilient means comprise raised D-shaped tabs integrally formed from the panel.

5. Apparatus as claimed in claim 4 wherein a first D-shaped tab for holding the base comprises an elongate portion, including the rounded end, raised above the surface of the panel sufficiently to engage the base.

6. Apparatus as claimed in claim 5 wherein second and third D-shaped tabs are spaced apart and oriented for positioning the base, when fully inserted into the slot, in cooperation with the first D-shaped tab.

7. Apparatus as claimed in claim 6 wherein the rounded end of the second D-shaped tab is located a distance from the associated slot approximately equal to the inside length of the base, and the rounded end of the third D-shaped tab is located a distance from the associated slot approximately equal to the outside length of the base, each tab oriented so that their respective rounded ends are adjacent the base, the third tab being opposed to and, toward the first tab, laterally offset from the second tab.

8. Apparatus as claimed in claim 7 wherein the wire of the resilient wire member is sized for providing sufficient resilient force to retain cables inserted between the parallel arms and snapping the base into a secure position as defined by the tabs, while allowing those tabs to resiliently return to their initial positions.

9. Apparatus as claimed in claim 8 wherein the width of the horizontal member approximately equals the length of the parallel arms of the resilient wire member.

10. Apparatus as claimed in claim 9 further comprising a mounting bracket including a substantially flat elongate section, having a length greater than or equal to that of the panel to which it is fixedly attached and two substantially flat integrally formed legs, projecting substantially perpendicularly from each end of the elongate section, each having mounting flanges projecting therefrom.

* * * * *